United States Patent
Fan et al.

(10) Patent No.: US 7,342,778 B2
(45) Date of Patent: Mar. 11, 2008

(54) PORTABLE COMPUTER WITH HANDLE ATTACHED THERETO

(75) Inventors: Qi-Fei Fan, Shenzhen (CN); Wen-Tang Peng, Tu-Cheng (TW); Wen-Kang Lo, Tu-Cheng (TW); Ke-Cheng Lin, Tu-Cheng (TW)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 224 days.

(21) Appl. No.: 11/143,360

(22) Filed: Jun. 2, 2005

(65) Prior Publication Data
US 2006/0104020 A1 May 18, 2006

(30) Foreign Application Priority Data
Nov. 12, 2004 (CN) .................. 2004 2 0095300 U (51) Int. Cl.
*H05K 7/00* (2006.01)
*E05B 73/00* (2006.01)
*A45F 5/10* (2006.01)

(52) U.S. Cl. ............................ 361/683; 70/58; 16/445; 248/917

(58) Field of Classification Search ................ 361/683, 361/679; 70/58; 16/445; 248/455, 551, 248/917–923
See application file for complete search history.

(56) References Cited

U.S. PATENT DOCUMENTS

| 4,858,162 | A | * | 8/1989 | Kieffer et al. | 361/683 |
| 5,293,300 | A | * | 3/1994 | Leung | 361/683 |
| 5,351,508 | A | | 10/1994 | Kelley | |
| 5,721,668 | A | * | 2/1998 | Barrus et al. | 361/683 |
| 6,097,592 | A | * | 8/2000 | Seo et al. | 361/683 |
| 6,115,883 | A | * | 9/2000 | Um | 16/405 |
| 6,163,450 | A | * | 12/2000 | Kim | 361/679 |
| 7,054,152 | B2 | * | 5/2006 | Francke et al. | 361/685 |
| 7,113,397 | B2 | * | 9/2006 | Lee | 361/683 |
| 2004/0096053 | A1 | * | 5/2004 | Francke et al. | 379/428.04 |
| 2006/0034045 | A1 | * | 2/2006 | Wang | 361/683 |

* cited by examiner

*Primary Examiner*—Jayprakash Gandhi
*Assistant Examiner*—Zachary M Pape
(74) *Attorney, Agent, or Firm*—Morris Manning Martin LLP; Tim Tingkang Xia, Esq.

(57) ABSTRACT

A portable computer (20) includes a main body (21), a retention portion (23) being arranged on the main body with a part thereof spaced apart from the main body, a fastener (30) detachably attaching a handle (10) between the main body and the retention portion, and means for retaining the fastener to the retention portion when the fastener is not in use for attaching the handle.

14 Claims, 10 Drawing Sheets

PORTABLE COMPUTER WITH HANDLE ATTACHED THERETO

BACKGROUND OF THE INVENTION

1. Field of the Invention

The present invention relates to a portable computer, and more particularly to a portable computer incorporates a handle.

2. General Background

Portable computers, such as laptop computers and notebook computers, have become increasingly popular for general use. To facilitate carrying portable computers, a handle is attached to a portable computer with screws. However, the screws are often lost by accident resulting in uselessness of the handle.

What is desired, therefore, is a portable computer which has an improved fixing mechanism to attach the handle thereto.

SUMMARY

In one preferred embodiment, a portable computer includes a main body, a retention portion being arranged on the main body with a part thereof spaced apart from the main body, a fastener for detachably attaching a handle between the main body and the retention portion, and means for retaining the fastener to the retention portion when the fastener is not in use for attaching the handle.

Other advantages and novel features will become more apparent from the following detailed description of preferred embodiments when taken in conjunction with the accompanying drawings, in which:

DETAILED DESCRIPTION OF THE EMBODIMENTS

Figure 1:
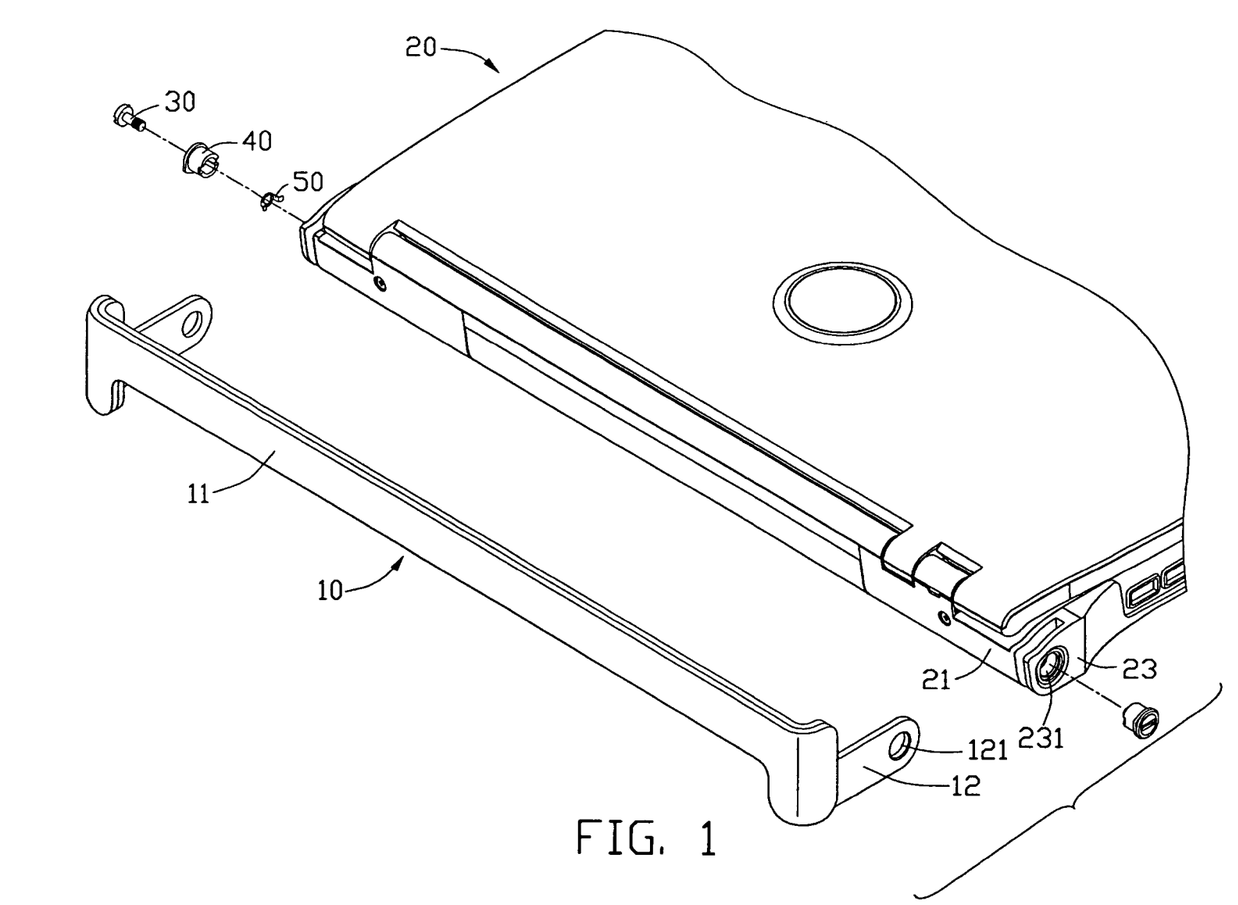
FIG. 1 is an exploded, isometric view of a portable computer and a handle in accordance with a preferred embodiment of the present invention, the portable computer including a main body, a pair of fasteners and a pair of fixing mechanisms.

Referring to FIG. 1, a handle 10 is provided to be used with a portable electronic device like a portable computer 20. The handle is a functional part of the portable computer 20 and capable of being used as a carrying handle in one of its positions and a stand of the computer 20 in another of its positions. The handle 10 includes a crossbar 11, and a pair of arms 12 protruding from opposite ends of the crossbar 11 respectively. A through hole 121 is defined in a free end of each arm 12. The portable computer 20 includes a main body 21. A pair of retention portions 23 protrudes rearward along lateral sides of the main body 21 respectively. The retention portions 23 are spaced from the main body 21. A through hole 231 is defined in a free end of each retention portion 23. A pair of threaded holes 211 (see FIG. 5) is defined in the main body 20 corresponding to the through holes 231.

Figure 2:
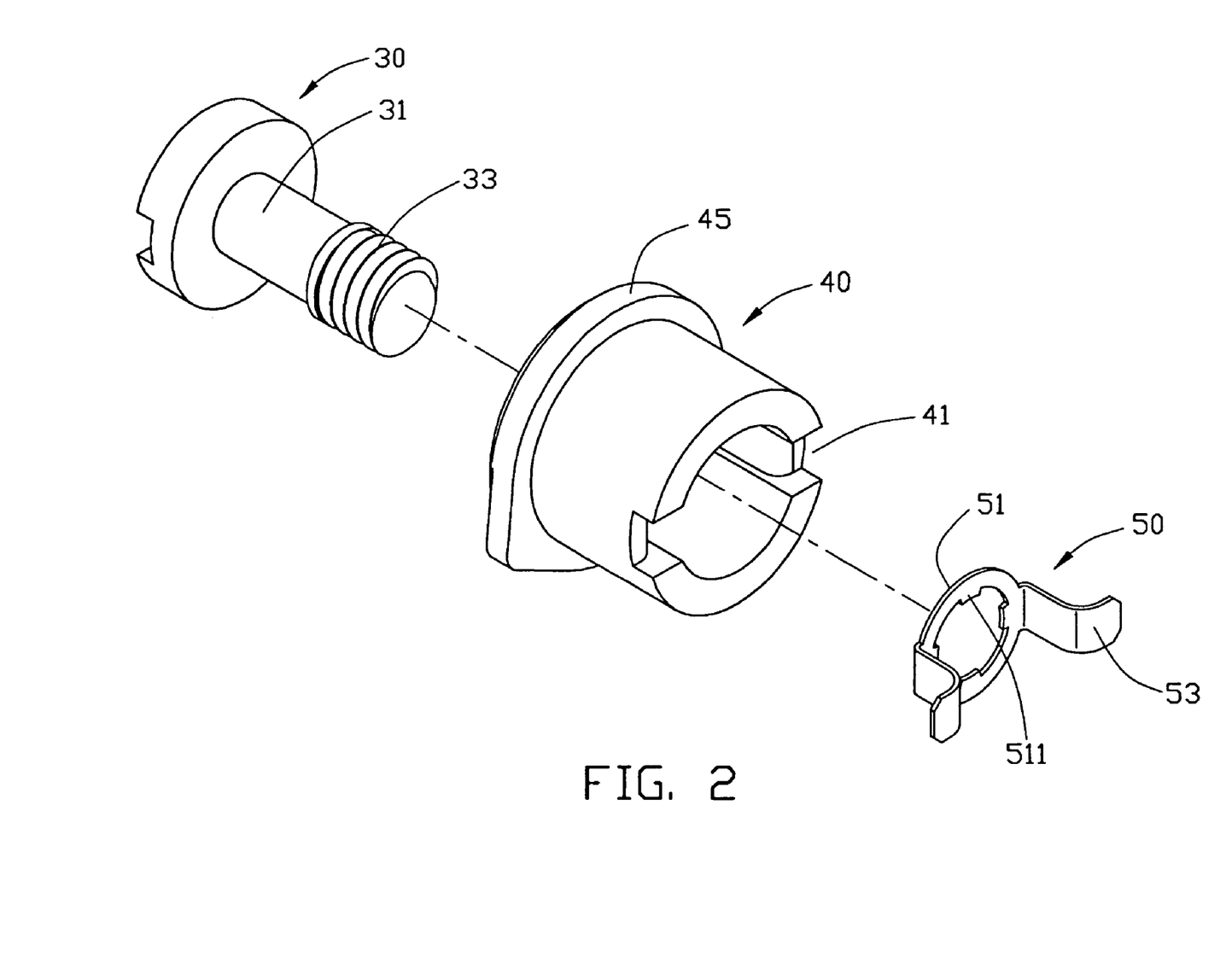
FIG. 2 is an enlarged isometric view of one fastener and one fixing mechanism of FIG. 1.
Figure 3:
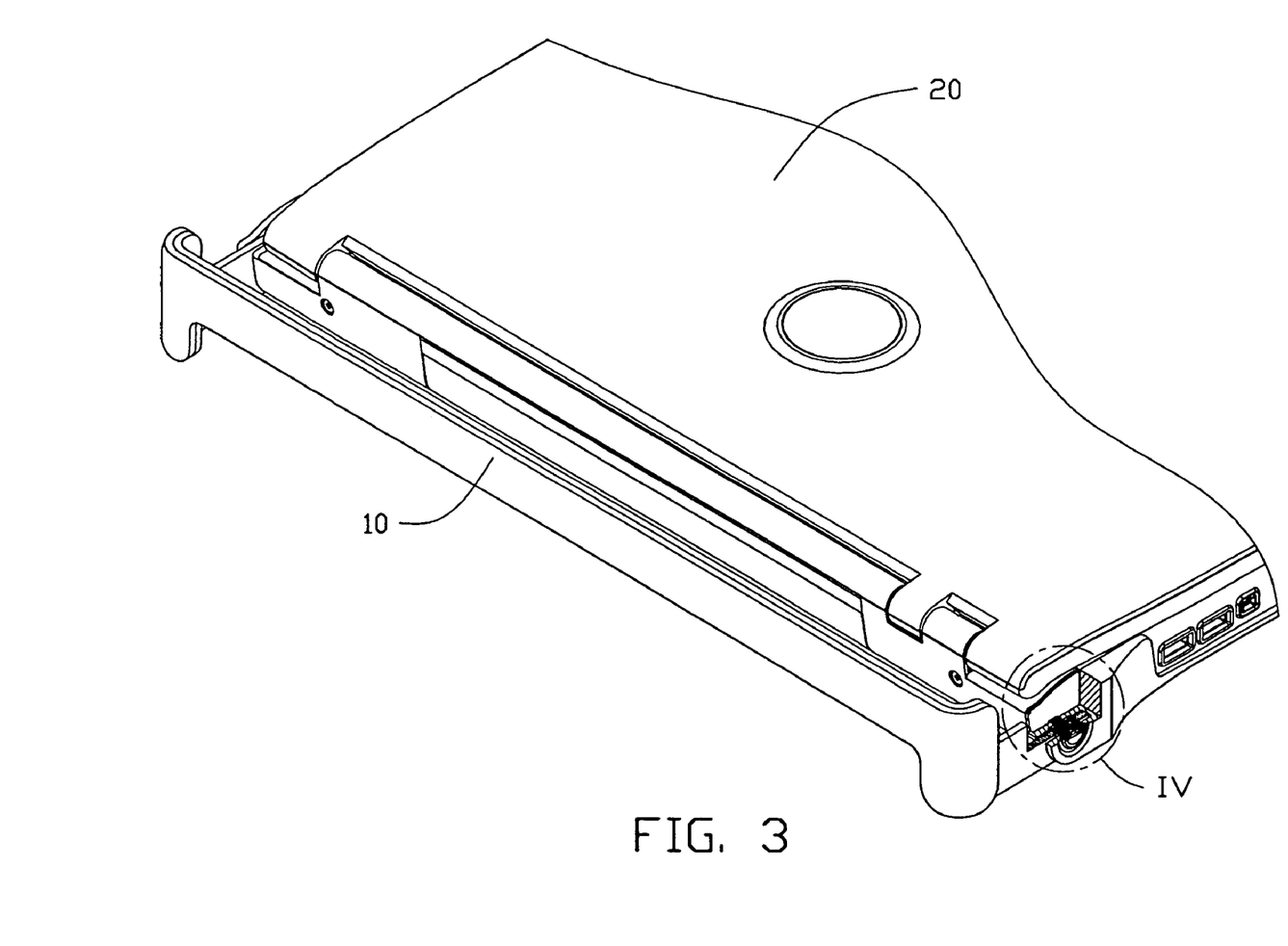
FIG. 3 is an assembled view of FIG. 1, showing a part thereof cut out.

Referring to FIGS. 1 to 3, a pair fasteners 30 and a pair of fixing mechanisms each including a bushing 40 and a clasping piece 50 are provided to attach the handle 10 to the main body 21 of the portable computer 20. The fastener 30 can be, for example, a bolt which includes a shaft portion 31 and a threaded portion 33. A diameter of the threaded portion 33 is larger than a diameter of the shaft portion 33. The bushing 40 includes a collar portion 45, and a pair of opposite notches 41 is defined at edge portion of an end thereof distal from the collar portion 45. An annular wall 43 is formed in the bushing 40 from internal surface thereof. The fastener 30 can be extended through the bushing 40 with a head portion of the fastener 30 blocked by the annular wall 43 of the bushing 40. The clasping piece 50 includes an annular base 51, and two opposite resilient clips 53 extending generally perpendicularly from an external perimeter of the annular base 51. Each clip 53 is generally L-shaped. A plurality of teeth 511 is formed from an internal perimeter of the annular main body 51 and generally locates in a same plane of the annular main body 51.

In assembly, the clasping piece 50 is inserted in the bushing 40, and the clips 53 engage the bushing 40 at the notches 41 respectively, with free ends of the clips 53 extending out of external surface of the bushing 40. The fastener 30 is extended through the bushing 40 and the clasping piece 50. The annular base 51 of the clasping piece 50 is dimensioned to allow the threaded portion 33 of the fastener 30 to be rotatably driven therethrough. The teeth 511 of the annular base 51 prevent the fastener 30 from exiting from the bushing 40, and the annular wall 43 of the bushing 40 engages the head portion of the fastener 30 to prevent the fastener 30 from being fully extended therethrough.

The arms 12 of the handle 10 are inserted between the main body 20 and the retention portions 23 respectively, with the through holes 121 of the arms 12 aligning with corresponding through holes 231 of the retention portions 23 and threaded holes 211 of the main body 20. The fastener 30 is pulled outwardly to drive the annular base 51 of the clasping piece 50 toward the annular wall 43 of the bushing 40, and the clips 53 retract toward each other. The free ends of the clips 53 are withdrawn in the bushing 40. The assembled fastener 30, bushing 40 and clasping piece 50 is then smoothly inserted through the through hole 231 of the retention portion 23 and the through hole 121 of the arm 12 of the handle 10.

Figure 4:
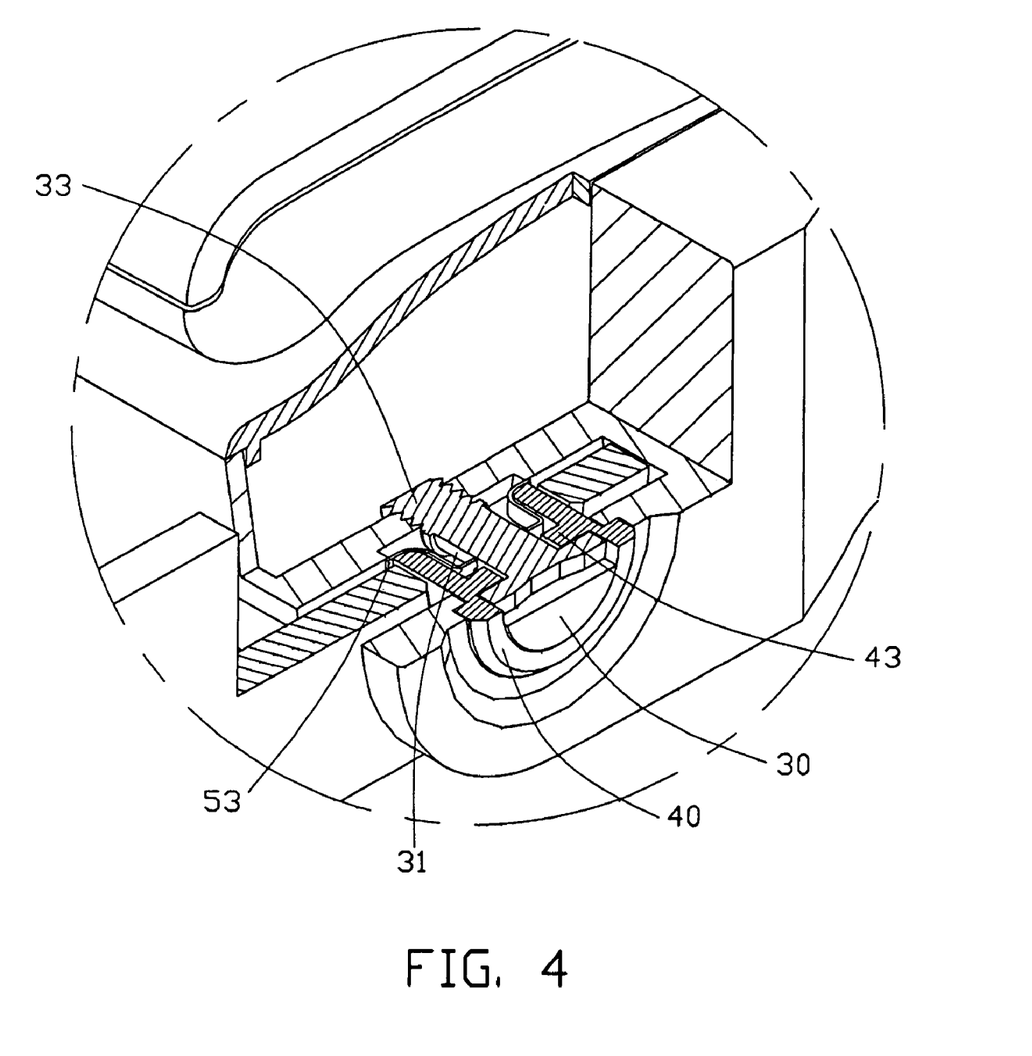
FIGS. 4 and 5 are enlarged views of a circled portion IV of FIG. 3, respectively showing the fastener and the fixing mechanism in different positions.

The fastener 30 is released, and the clips 53 of the clasping piece 50 are restored to extend the free ends thereof out of the external surface of the bushing 40. The fastener 30 is then screwed in the threaded hole 211 of the main body 20. The collar potion 45 of the bushing 40 engages external surface of the retention portion 23. FIGS. 3 and 4 show the handle 10 is attached to the main body 20, and the handle 10 is rotatable along the bushing 40 and facilitates carrying the portable computer 20.

Figure 5:
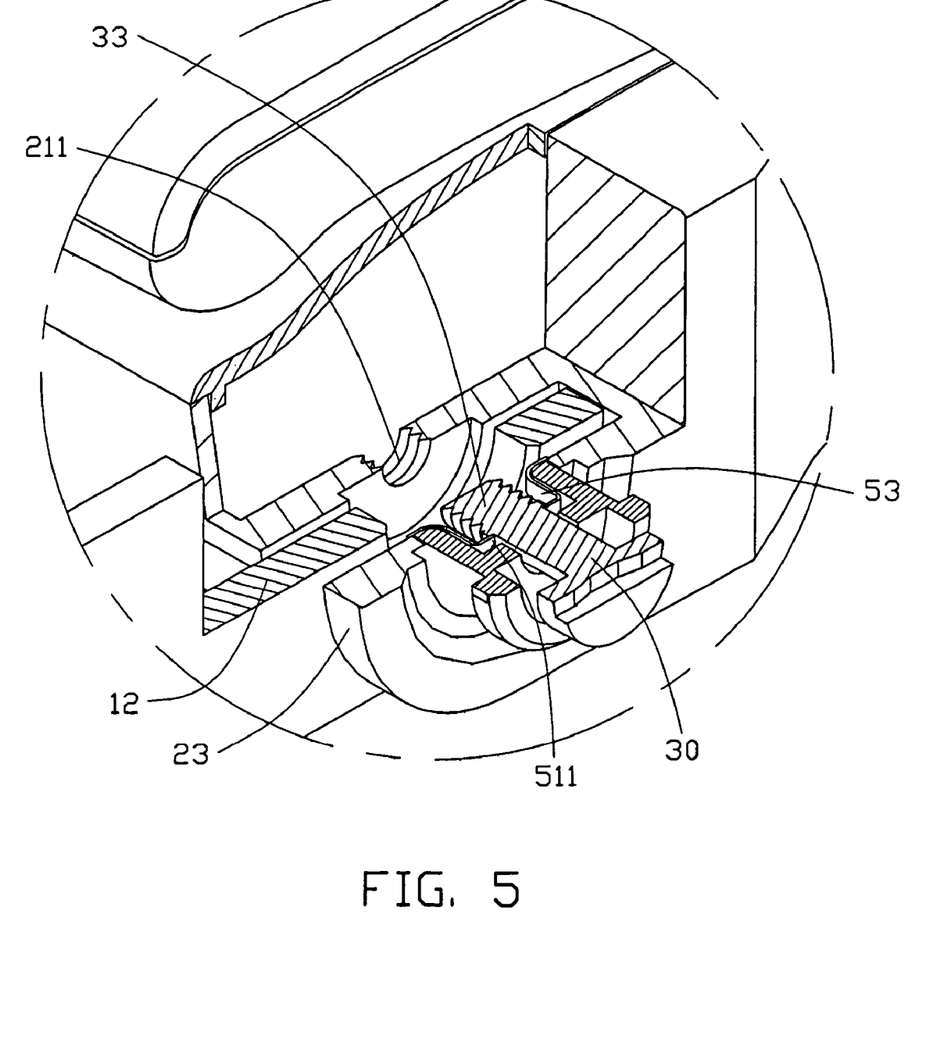

When it is desired to detach the handle 10 from the main body 20, the fastener 30 is disengaged from the threaded hole 211 of the main body 20. Referring to FIG. 5, the assembled fastener 30, bushing 40 and clasping piece 50 is pulled outwardly to withdraw from the arm 12 of the handle 10, until the free ends of the clips 53 of the clasping piece 50 contact the retention portion 23 of the main body 20, and the clasping piece 50 is prevented from further movement. The handle 20 is ready to be detached, and the assembled fastener 30, bushing 40 and clasping piece 50 is retained at the retention portion 23 of the main body 20.

FIGS. 6 to 9 show an alternative embodiment of the fixing mechanism which includes a bushing 60. The bushing 60 includes a collar portion 65 and a pair of opposed resilient catches 61 formed at an end thereof. An annular wall 63 is formed in the bushing 60 from internal surface thereof. A plurality of teeth 631 is formed at the annular wall 63, corresponding to the threaded portion 33 of the fastener 30.

Figure 6:
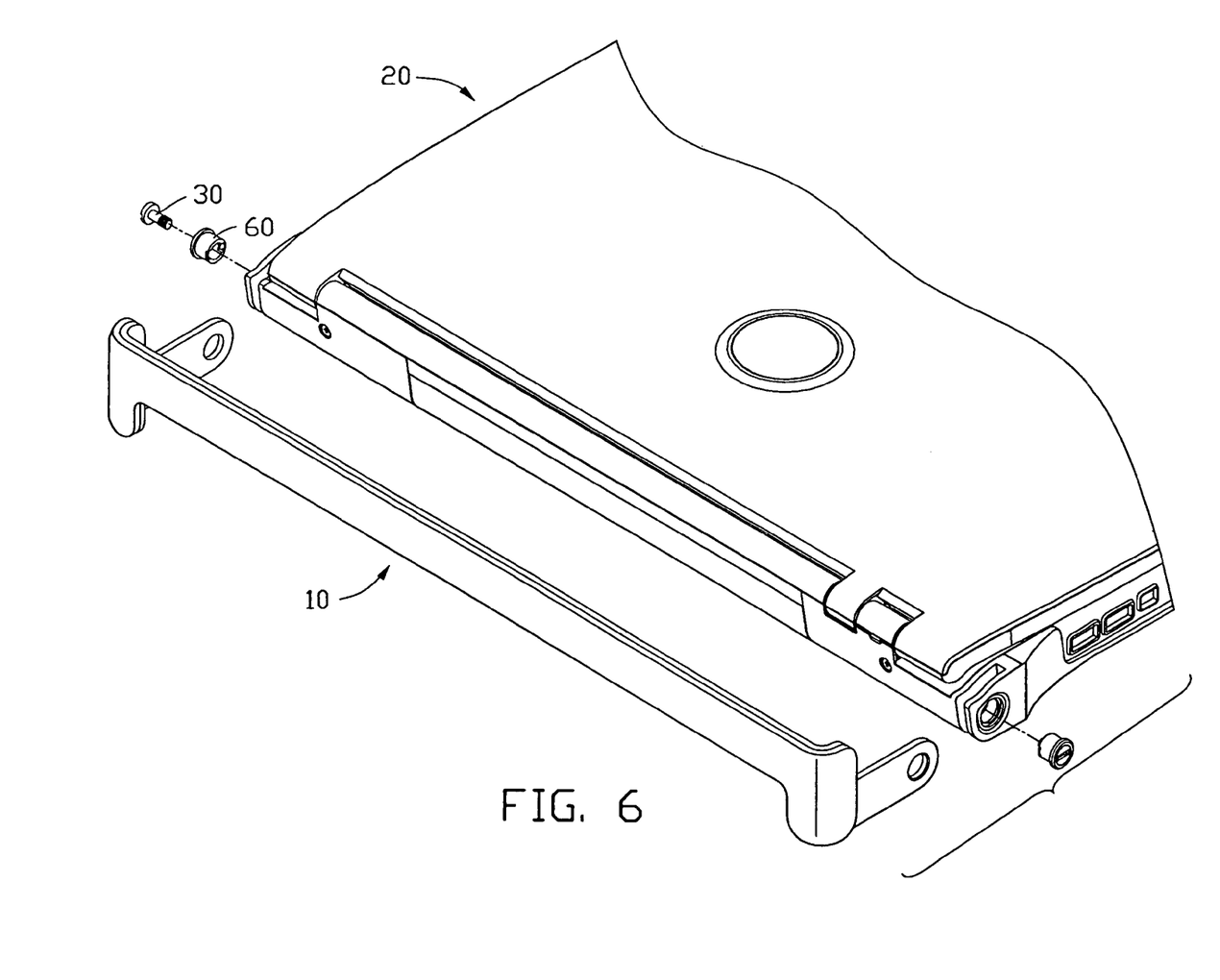
FIG. 6 is an exploded, isometric view of a portable computer and a handle in accordance with an alternative preferred embodiment of the present invention, the portable computer including a main body, and a pair of fixing mechanisms.
Figure 7:
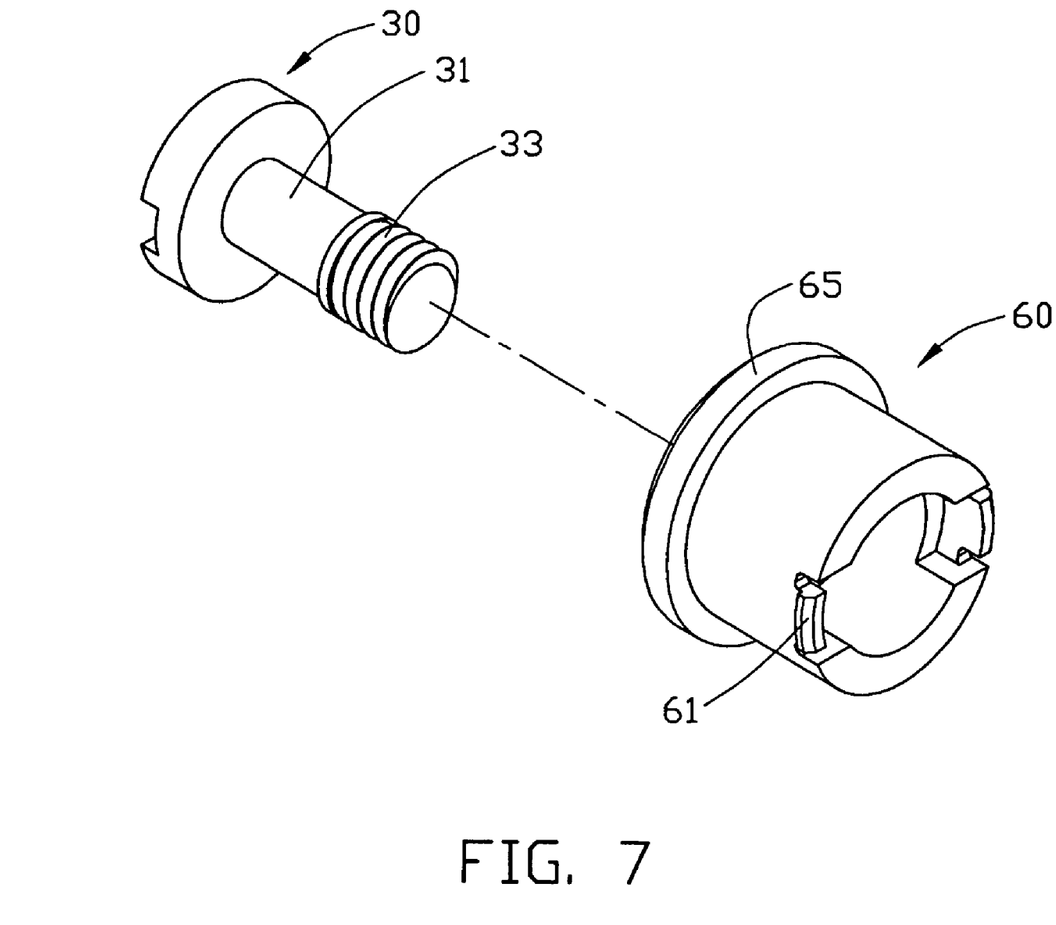
FIG. 7 is an enlarged isometric view of one fastener and one fixing mechanism of FIG. 1.
Figure 8:
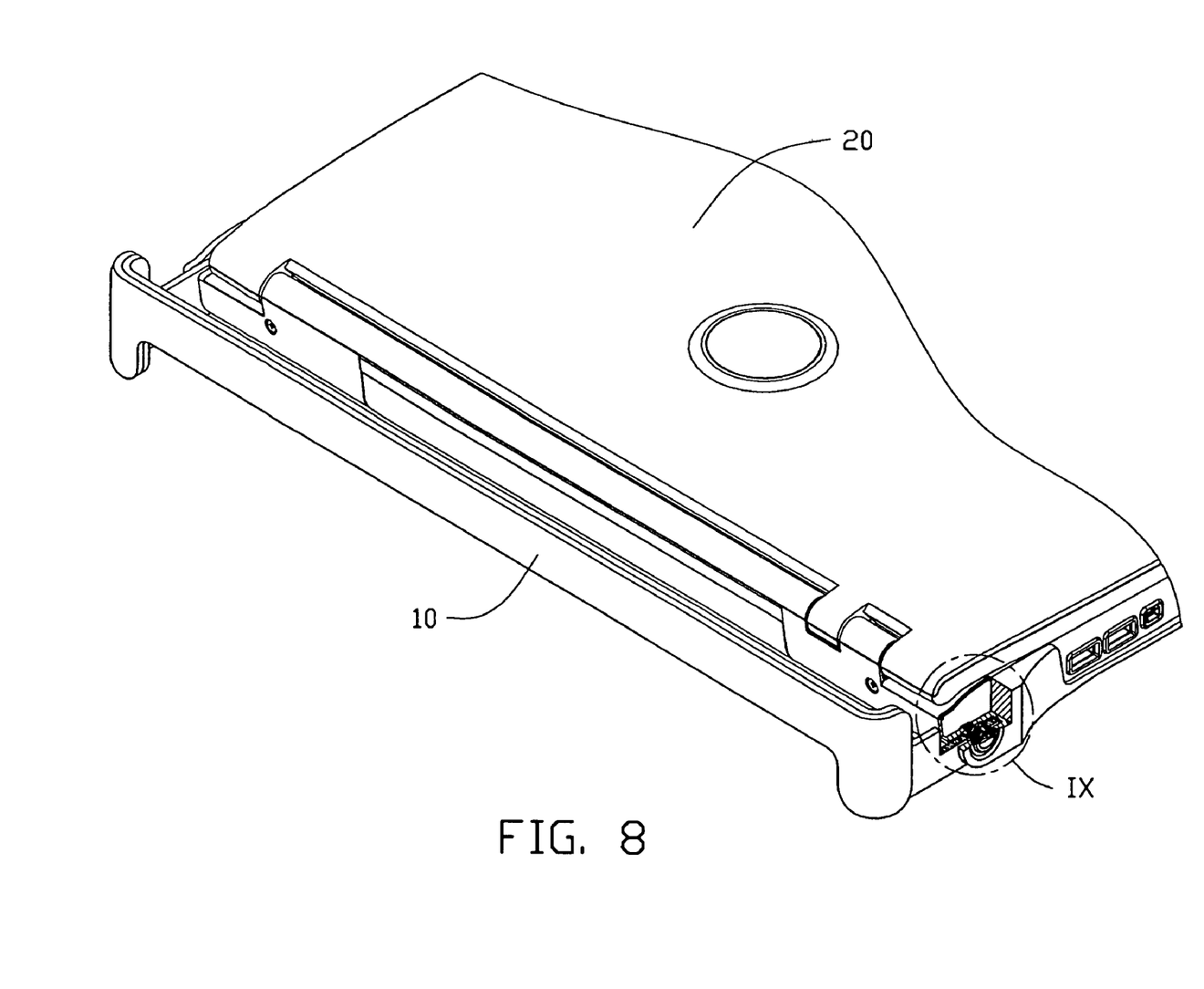
FIG. 8 is an assembled view of FIG. 6, showing a part thereof cut out.

In use, the fastener 30 is assembled to the bushing 60 by rotatably extending the threaded portion 33 of the fastener 30 through the annular wall 63 of the bushing 60. The assembled fastener 30 and bushing 60 is inserted through the retention portion 23 of the main body 20. The catches 61 of the bushing 60 are urged by the through hole 231 of the retention portion 23 to retract toward each other thereby allowing the bushing 60 to pass through.

Figure 9:
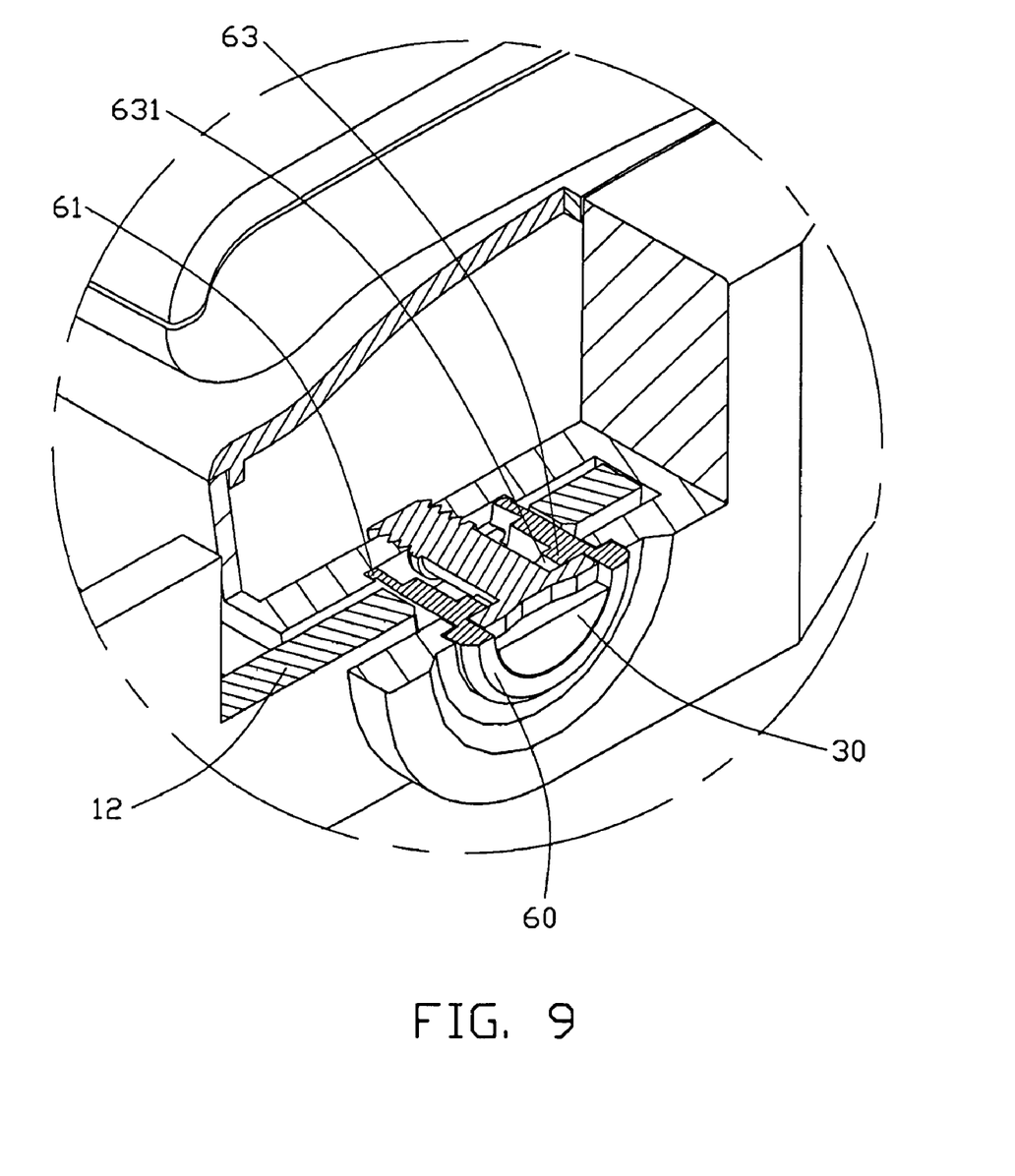
FIGS. 9 and 10 are enlarged views of a circled portion IX of FIG. 8, respectively showing the fastener and the fixing mechanism in different positions.

FIG. 9 shows the handle 10 is attached to the main body 20, the fastener 30 is engaged in the threaded hole 211 of the main body 20, the catches 61 of the bushing 60 are restored, and the collar portion 65 of the bushing 60 engages external surface of the retention portion 23 of the main body 20.

Figure 10:
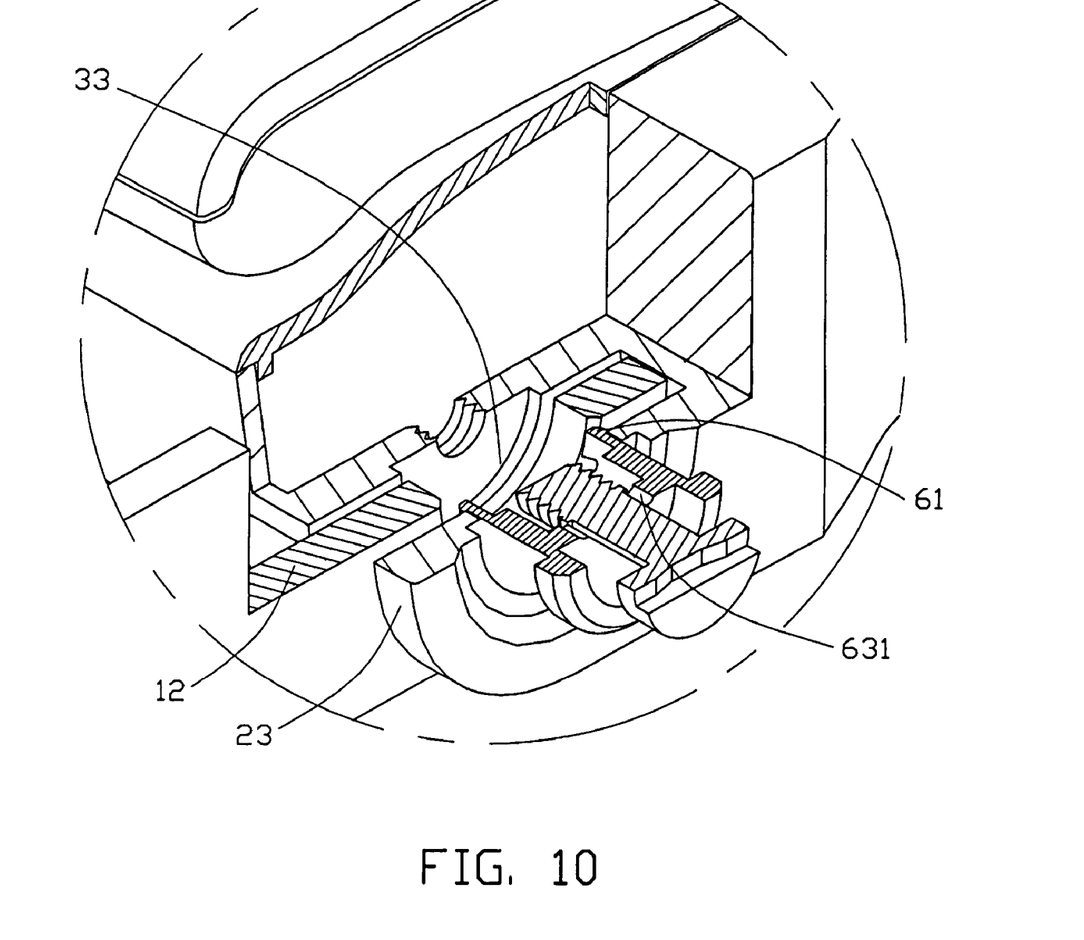

FIG. 10 shows the handle 10 is ready to be detached from the main body 20, and the assembled fastener 10 and bushing 60 is retained to the main body 20 with the catches 61 of the bushing 60 engaging internal surface off the retention portion 23.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

The invention claimed is:

1. A portable computer, comprising:
    a main body, a retention portion being arranged on the main body with a part thereof spaced apart from the main body;
    a fastener for detachably attaching a handle between the main body and the retention portion; and
    a bushing extending through and movably retained to the retention portion, and the fastener being movably retained in the bushing.

2. The portable computer as claimed in claim 1, wherein a through hole is defined in the retention portion, the bushing comprises a collar portion and two resilient catches arranged at a distal end, the through hole of the retention portion is dimensioned to allow the distal end of the bushing to extend therethrough and prevent the collar portion from extending therethrough, and the catches are capable of engaging the retention portion to prevent the bushing from withdrawing from the through hole of the retention portion.

3. The portable computer as claimed in claim 2, wherein an annular wall is formed on an internal surface of the bushing, and the fastener comprises a head portion and a threaded portion respectively located adjacent opposite sides of the annular wall of the bushing.

4. The portable computer as claimed in claim 3, wherein a threaded hole is defined in the main body receiving the threaded portion of the fastener.

5. The portable computer as claimed in claim 1, further comprising a clasping piece detachably received in the bushing, the clasping piece comprising a base and two resilient clips capable of engaging an internal surface of the retention portion, and the fastener defining a portion capable of engaging the base of the clasping piece to prevent the fastener from withdrawing from the bushing.

6. The portable computer as claimed in claim 5, wherein the portion of the fastener is a threaded portion, a plurality of teeth is formed from the base of the clasping piece to enable the threaded portion of the fastener to be driven therethrough.

7. The portable computer as claimed in claim 6, wherein the bushing comprises a collar portion capable of engaging an external surface of the retention portion, and an annular wall is formed inwardly from the bushing to engage a head portion of the fastener.

8. The portable computer as claimed in claim 5, wherein the bushing defines two notches in an end thereof, and free ends of the clips extend out of an external surface of the bushing from the notches respectively.

9. A portable computer comprising:
    a main body, a retention portion being arranged to the main body, the retention portion defining a through hole therein;
    a fastener extending through the through hole of the retention portion for detachably attaching a handle to the main body, the fastener comprising a head portion, a shaft portion and a threaded portion; and
    a fixing mechanism movably and detachably connected to the retention portion allowing the threaded portion of the fastener to be rotatably driven therethrough, the fastener retained to the fixing mechanism in such a manner that the fastener is movable with respect to the fixing mechanism along the shaft portion of the fastener, wherein the fixing mechanism comprises a bushing extending through the through hole of the retention portion and a clasping piece detachably received in the bushing, the clasping piece comprises a base and two resilient clips capable of engaging an internal surface of the retention portion, and the base forms a plurality of teeth corresponding to the threaded portion of the fastener.

10. The portable computer as claimed in claim 9, wherein the bushing comprises a collar portion capable of engaging an external surface of the retention portion, and an annular wall is formed inwardly from the bushing to engage the head portion of the fastener.

11. The portable computer as claimed in claim 9, wherein the bushing defines two notches in an end thereof, and free ends of the clips extend out of an external surface of the bushing from the notches respectively.

12. A portable electronic device comprising:
a main body of said portable electronic device;
a functional part separately and movably attachable to said main body;
a fastener capable of attaching said functional part to said main body; and
means for retaining said fastener to said main body, said means comprising a bushing and allowing said fastener to move together with said bushing in said main body without separation from said main body, wherein said functional part is a handle capable of being hand-held in a first position thereof and being used as a stand of said portable electronic device in a second position thereof.

13. The portable electronic device as claimed in claim 12, wherein said means for retaining is a combination of the bushing and a clasping piece.

14. The portable electronic device as claimed in claim 12, wherein the bushing comprises a plurality of catches formed thereon.

\* \* \* \* \*